(12) United States Patent
Shank

(10) Patent No.: US 10,679,640 B2
(45) Date of Patent: Jun. 9, 2020

(54) CARDIOID MICROPHONE ADAPTIVE FILTER

(71) Applicant: HARMAN INTERNATIONAL INDUSTRIES, INCORPORATED, Stamford, CT (US)

(72) Inventor: Kevin Shank, Canoga Park, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/542,654

(22) Filed: Aug. 16, 2019

(65) Prior Publication Data

US 2020/0058315 A1 Feb. 20, 2020

Related U.S. Application Data

(60) Provisional application No. 62/764,967, filed on Aug. 16, 2018.

(51) Int. Cl.
| | |
|---|---|
| *G10L 21/0232* | (2013.01) |
| *H04R 3/00* | (2006.01) |
| *H04R 1/08* | (2006.01) |
| *H04R 1/24* | (2006.01) |
| *H04R 1/40* | (2006.01) |
| *G10L 21/0216* | (2013.01) |

(52) U.S. Cl.
CPC ............ *G10L 21/0232* (2013.01); *H04R 1/08* (2013.01); *H04R 1/245* (2013.01); *H04R 1/406* (2013.01); *H04R 3/005* (2013.01); *G10L 2021/02166* (2013.01); *H04R 2410/07* (2013.01)

(58) Field of Classification Search
USPC .................. 381/71.11, 92, 94.2, 94.3, 356
See application file for complete search history.

(56) References Cited

U.S. PATENT DOCUMENTS

| | | | |
|---|---|---|---|
| 7,324,649 B1* | 1/2008 | Knapp | ................. H04R 25/405 |
| | | | 381/312 |
| 9,491,543 B1* | 11/2016 | Konchitsky | ......... G10L 21/0208 |
| 2008/0019548 A1* | 1/2008 | Avendano | .............. H04R 3/005 |
| | | | 381/313 |

* cited by examiner

*Primary Examiner* — Yosef K Laekemariam
(74) *Attorney, Agent, or Firm* — Brooks Kushman P.C.

(57) ABSTRACT

Cardioid adaptive filtering includes receiving a first and second audio signals from first and second omnidirectional microphones; combining the audio input signals into a cardioid signal; filtering the cardioid signal to create a first filtered output using an adaptive low pass filter controlled by a frequency control, the adaptive low pass filter having a controllable corner frequency $f_1$; filtering the first filtered output, using a high frequency gain filter with a corner frequency $f_2$, to create an equalized cardioid output signal; performing feedforward processing of the audio input signals to provide a wind feedforward signal; using the equalized cardioid output and the first or second audio input signal, performing proximity feedback to generate a proximity feedback signal; adjusting the frequency $f_1$ of the adaptive low pass filter using the wind feedforward signal and the proximity feedback signal; and providing the equalized cardioid output signal for use in receiving captured audio.

23 Claims, 3 Drawing Sheets

CARDIOID MICROPHONE ADAPTIVE FILTER

CROSS-REFERENCE TO RELATED APPLICATIONS

This application claims the benefit of U.S. provisional application Ser. No. 62/764,967 filed Aug. 16, 2018, the disclosure of which is hereby incorporated in its entirety by reference herein.

TECHNICAL FIELD

Aspects of the disclosure generally relate to an adaptive filter for equalization of wind noise and proximity gain for a cardioid microphone.

BACKGROUND

When a user speaks in close proximity to a microphone, the user's voice acquires a more bass-heavy sound. This increase in low frequency response of the microphone may be referred to as proximity gain or the proximity effect. Because cardioid microphones are sensitive to proximity gain, such microphones may be equalized in a studio setting to avoid the effect for a user speaking a defined distance from the microphone.

When a microphone is used outdoors, wind may cause the microphone to pick up undesirable low-frequency noise. Equalizing down the low-frequency content from the microphone signal can reduce audible wind noise, but also reduces the useful response of the microphone when the wind is not present.

SUMMARY

In one or more illustrative examples, an audio device for performing cardioid adaptive filtering includes first and second omnidirectional microphones, the first omnidirectional microphone configured to provide a first audio input signal, the second omnidirectional microphone configured to provide a second audio input signal; and an audio processor, programmed to combine the first and second audio input signals into a cardioid signal, filter the cardioid signal to create a first filtered output using an adaptive low pass filter controlled by a frequency control, the adaptive low pass filter having a controllable corner frequency $f_1$, filter the first filtered output, using a high frequency gain filter with a corner frequency $f_2$, to create an equalized cardioid output signal, perform feedforward processing of the first and second audio input signals to provide a wind feedforward signal, using the equalized cardioid output and the first or second audio input signal, perform proximity feedback to generate a proximity feedback signal, adjust the frequency $f_1$ of the adaptive low pass filter using the wind feedforward signal and the proximity feedback signal, and provide the equalized cardioid output signal for use in receiving captured audio.

In one or more illustrative examples, a method for performing cardioid adaptive filtering includes receiving a first audio input signal from a first omnidirectional microphone; receiving a second audio input signal from a second omnidirectional microphone; combining the first and second audio input signals into a cardioid signal; filtering the cardioid signal to create a first filtered output using an adaptive low pass filter controlled by a frequency control, the adaptive low pass filter having a controllable corner frequency $f_1$; filtering the first filtered output, using a high frequency gain filter with a corner frequency $f_2$, to create an equalized cardioid output signal; performing feedforward processing of the first and second audio input signals to provide a wind feedforward signal; using the equalized cardioid output and the first or second audio input, performing proximity feedback to generate a proximity feedback signal; adjusting the frequency $f_1$ of the adaptive low pass filter using the wind feedforward signal and the proximity feedback signal; and providing the equalized cardioid output signal for use in receiving captured audio.

In one or more illustrative examples, a non-transitory computer-readable medium includes instructions for performing cardioid adaptive filtering comprising that, when executed by an audio processor, cause the audio processor to receive a first audio input signal from a first omnidirectional microphone; receive a second audio input signal from a second omnidirectional microphone; combine the first and second audio input signals into the cardioid signal by subtracting a delayed version of second audio input signal from the first audio signal; filter the cardioid signal to create a first filtered output using an adaptive low pass filter controlled by a frequency control, the adaptive low pass filter having a controllable corner frequency $f_1$; filter the first filtered output, using a high frequency gain filter with a corner frequency $f_2$, to create an equalized cardioid output signal; perform feedforward processing of the first and second audio input signals to provide a wind feedforward signal; use the equalized cardioid output and the first or second audio input, performing proximity feedback to generate a proximity feedback signal; adjust the frequency $f_1$ of the adaptive low pass filter using the wind feedforward signal and the proximity feedback signal; and provide the equalized cardioid output signal for use in receiving captured audio.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Cardioid microphones are usually implemented as a pressure gradient across the front and back of a single microphone. Thus, omnidirectional pressure is unavailable for signal processing to use as a reference for adaptive filtering. However, by using multiple low-cost electric condenser (ECM) or microelectro-mechanical systems (MEMs) omnidirectional microphones, a cardioid algorithm can be implemented using omnidirectional front and back microphones.

Such paired omnidirectional microphones, as conventionally used for cardioid flexibility, enable a low order hybrid adaptive controlling equalizer that addresses both wind noise and proximity gain using a single filter. The feedforward controller detects significant bass pressure gradients that indicate wind noise, and offsets the feed-back controller that detects that the cardioid output has unwanted bass proximity gain which is equalized using an adaptive bass shelving filter. As explained in detail below, the disclosed system compares the omnidirectional pressures to detect and equalize wind noise controlling the same filter that is used to equalize proximity gain from the cardioid algorithm.

Figure 1:
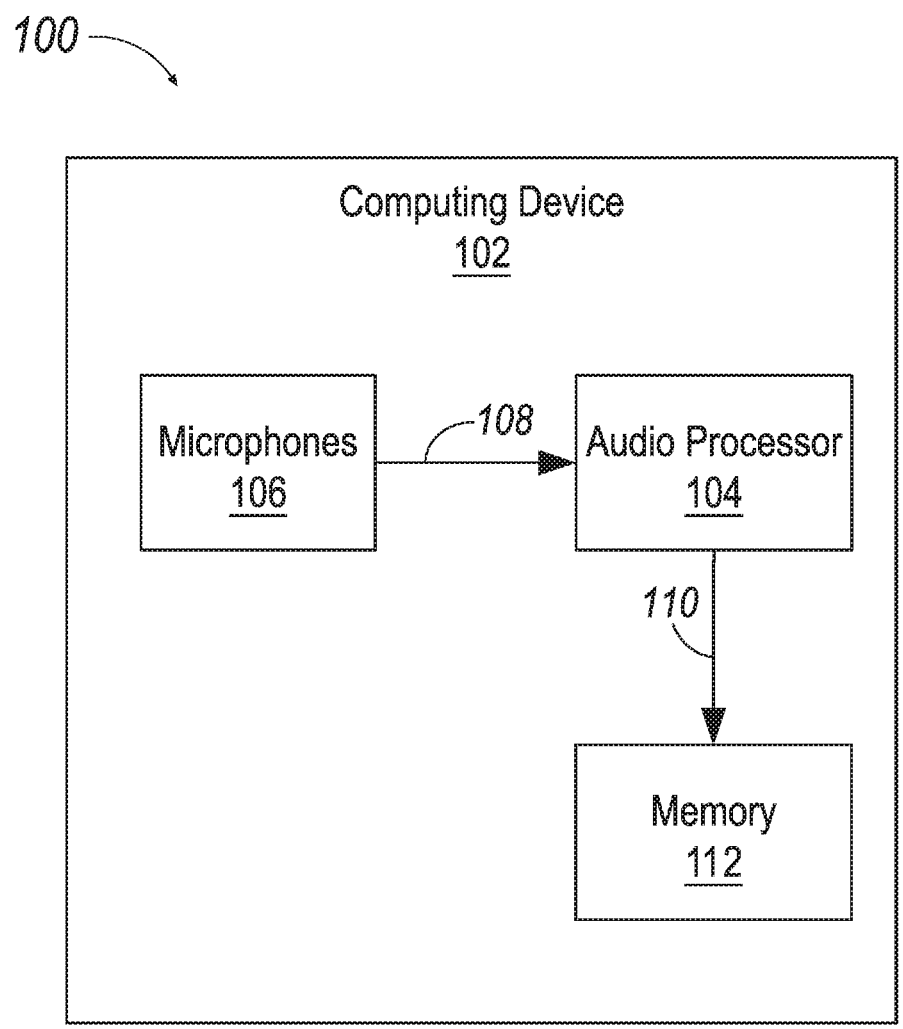
FIG. 1 illustrates an example system for performing cardioid microphone adaptive filtering.

FIG. 1 illustrates an example audio system 100 for performing cardioid adaptive filtering. The audio system 100 includes a computing device 102 having at least an audio processor 104 and a pair of omnidirectional microphones 106. One of the microphones 106 may be located on a front of the device 102, while the other microphone may be located on the back of the device 102. More generally, the microphones 106 may be mounted to opposite sides, adjacent sides, or the same side of the device 102 with a setback, in order to create a directional sound vector. The audio processor 104 receives audio input signals 108 from each of the microphones 106, processes the audio input signals 108 into equalized cardioid output signals 110, and provides the equalized cardioid output signals 110 for use. In an example, the equalized cardioid output signals 110 may be recorded to the memory 112. Example audio systems 100 include a wearable audio or audio/video recorder device, a voice-activated 'smart' portable, a cellular telephone, a smart speaker, or any other mobile or other device having audio receiving and sufficient processing capabilities. It should be noted that the illustrated audio system 100 is merely an example, and more, fewer, and/or differently located elements may be used.

While only one is shown, one or more audio processors 104 may be included in the computing device 102. The audio processors 104 may be one or more processing devices capable of processing audio and/or video signals, such as a computer processor, microprocessor, a digital signal processor, or any other device, series of discrete devices, or other mechanisms capable of performing logical operations. The audio processors 104 may operate in association with the memory 112 to execute instructions stored in the memory 112. The instructions may be in the form of software, firmware, computer code, or some combination thereof, and when executed by the audio processors 104 may provide for the cardioid adaptive filtering as discussed in detail below. The memory 112 may be any form of one or more data storage devices, such as volatile memory, non-volatile memory, electronic memory, magnetic memory, optical memory, or any other form of data storage device. In addition to instructions, operational parameters and data may also be stored in the memory 112, such as user preferences or the resultant equalized cardioid output signals 110.

Figure 2:
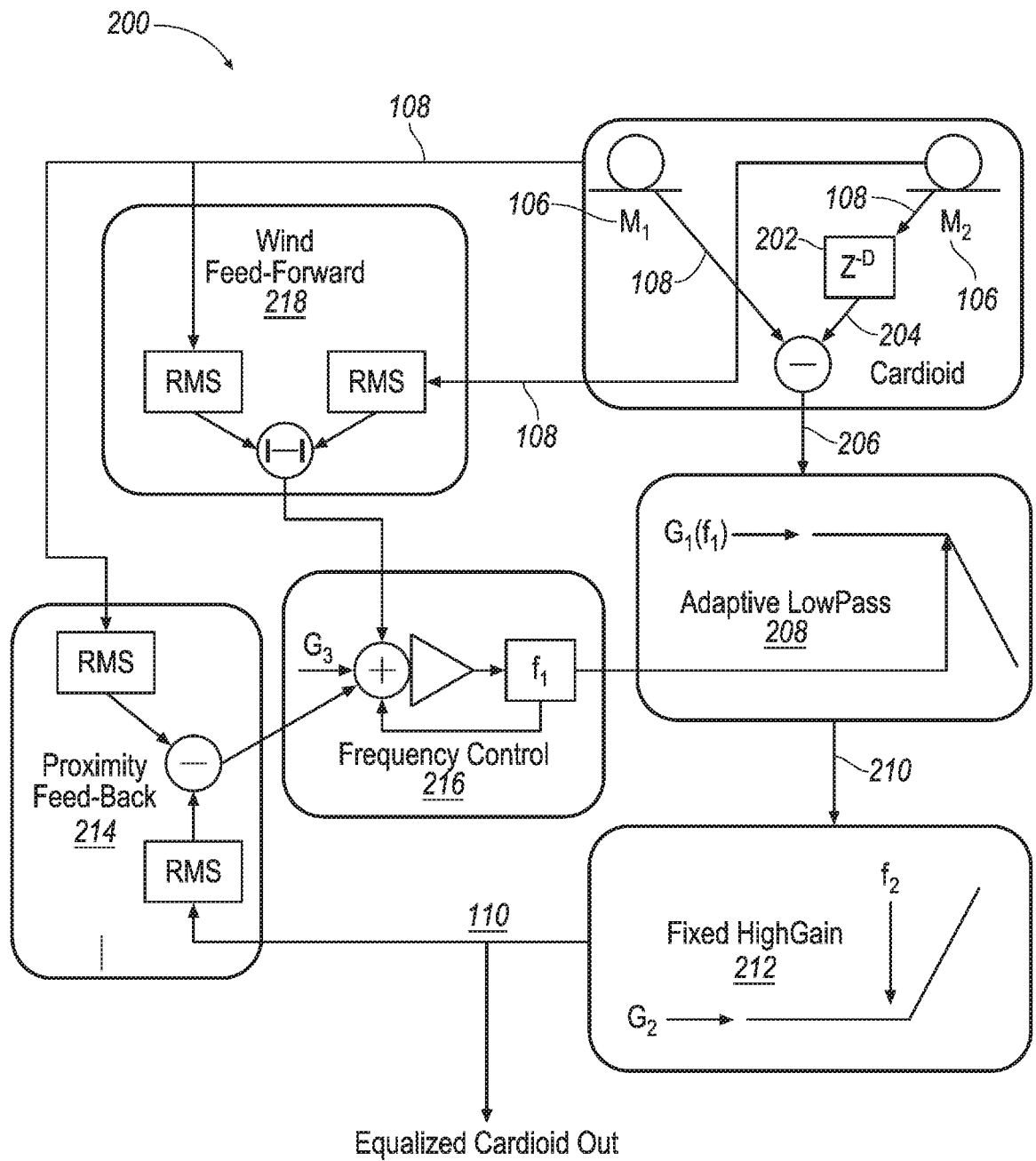
FIG. 2 illustrates an example control data flow diagram of audio processing for cardioid microphone adaptive filtering.

FIG. 2 illustrates an example control flow diagram 200 of audio processing for cardioid adaptive filtering. The illustrated control flow may be performed by the one or more audio processors 104 of the computing device 102.

Cardioid microphones are desirable in recording and performance applications because they provide constant directivity over a wide bandwidth, yet are implementable with low order processing. The same performance is desirable in voice-activated 'smart' portable and wearable devices if problems of wind noise and proximity gain are resolved. Paired omnidirectional microphones, as conventionally used for cardioid flexibility, enable a low order hybrid adaptive controlling equalizer that can address these performance issues.

As shown, the audio processing begins with audio input signals 108 received from a pair of omnidirectional microphones 106, the microphones 106 being referred to herein as $M_1$ and $M_2$. Notably, the external acoustic delay from the first omnidirectional microphone $M_1$ to the second microphone $M_2$ varies with sound direction, enabling an internal delay difference operation that results in constant directivity with undesirable first order frequency sensitivity.

Matched internal/external delays create deconstructive interference for sound moving in the directional vector from the second microphone $M_2$ to the first microphone $M_1$. Surface geometry may make this delay frequency-dependent. Mismatched delays and mismatched omnidirectional sensitivity can (un)intentionally vary the directional/frequency sensitivity. The internal delay is implementable in acoustical, electrical or digital domains; in the digital domain, the delay D might be an integer number of samples resulting in a simple delay line or it might be a real number requiring a more advanced interpolation filter. This delay 202 is illustrated as $Z^{-D}$ in the signal path of the audio signal from the microphone $M_2$, resulting in delayed signal 204. The audio input signal 108 from $M_1$ and the delayed signal 204 from $M_2$ may be subtracted to create a cardioid signal 206.

As mentioned above, cardioid first order frequency sensitivity has a decrease in lower frequency response when a sound source is far from a cardioid microphone; this may be offset within the system gain limits. This first order frequency sensitivity can be compensated with an inversion filter that receives the cardioid signal 206. The inversion filter may have a first order gain that decreases with frequency; though in many examples a shelving filter may be used having a first order gain that decreases from a first frequency to the second frequency, with constant gain outside the first to second frequency band. This shelving filter can be decomposed into a first filter 208 that receives the cardioid signal 206 and provides a first filtered output 210, and a second filter 212 that receives the first filtered output 210 and provides an equalized cardioid output 110. The first filter 208 may be first order and may have a constant gain below the first frequency $f_1$ and decreasing gain above the first frequency. The second filter 212 may also be of the first order and may have a constant gain below the second frequency $f_2$ and increasing gain above the second frequency $f_2$.

This shelving filter may amplify low frequency near-field spherical waves (aka proximity gain) as the cardioid math assumes far-field plane waves. A feedback control algorithm including proximity feedback 214 and frequency control 216 may be used with the first filter 208, which is an adaptive filter to offset this amplification. As shown in the proximity feedback 214 block, a scaled time-averaged low frequency RMS (root-mean-square) level difference is computed between the RMS of the cardioid output 110 and the RMS of one of the omnidirectional microphone inputs 108. As the microphone inputs 108 are omnidirectional, they are not susceptible to the proximity effect. Thus, the proximity feedback 214 uses one of the omnidirectional microphone inputs 108 as a reference to determine how different the cardioid bass level is as compared to the omnidirectional input bass level. The frequency control 216 receives this difference as an input, and, in response, adapts the first frequency $f_1$ to reduce this difference. For example, if the difference is significant, then the frequency control 216 may make a relatively larger adjustment to the $f_1$ corner frequency, while if the difference is small, then the frequency control 216 may make little to no adjustment to the $f_1$ frequency. The gain value $G_1(f_1)$ of the filter 208 may be calculated from the first order frequency sensitivity, which may be predetermined based on reference or actual microphone spacing. If the cardioid is part of a multichannel array of cardioids, then the worst-case frequency may be chosen to preserve multichannel balance. Minimum and maximum frequency bounds may limit the maximum and minimum gain as well.

In some circumstances, it may be desirable to apply an equalization to the bass level independent of the feedback control algorithm. As shown, a fixed gain offset ($G_3$) may also be applied to the frequency control 216 as an additional summed input to be used if a non-flat equalization is desired.

Thus, by using the feedback control algorithm the system may provide for an actively diminished bass boost that can counteract the proximity effect. However, in some cases, the microphones 106 may experience issues with wind noise. When windy conditions are experienced, the microphones $M_1$ and $M_2$ will experience micro-turbulence from the wind at different levels. This wind may be detected by differences in the signals provided by each of the microphones $M_1$ and $M_2$. More specifically, a wind feed-forward 218 control may determine a signal that represents the scaled time-averaged low frequency RMS level absolute-value difference between the $M_1$ and $M_2$ omnidirectional microphone inputs 108.

This absolute-value difference signal may be applied as a further input to the frequency control 216, in addition to the input from the proximity feedback 214 and the fixed gain offset $G_3$. Thus, the input to the feedback control 216 that adjusts the first frequency $f_1$ is also offset by the absolute-value difference from the wind feed-forward 218 control. This is done to implement low-frequency gain reduction in case there is a significant pressure difference likely caused by uncorrelated micro-turbulence being experienced by the microphones 106 due to wind or breathing.

The RMS level calculations discussed herein can be performed in various manners, such as using a bass band exponential moving average filter, using a moving block time average, or by way of audio frame averages. The bass band filter depends on the excess gain bandwidth experienced from the cardioid application (i.e., a 20-200 Hz $8^{th}$ order Butterworth filter). Rather than using computationally-expensive logarithmic decibel RMS scaling, the squared power difference or absolute pressure difference are suitable measures with adjustment to the level scaling to find a balance between jittery updates and unresponsive updating.

Figure 3:
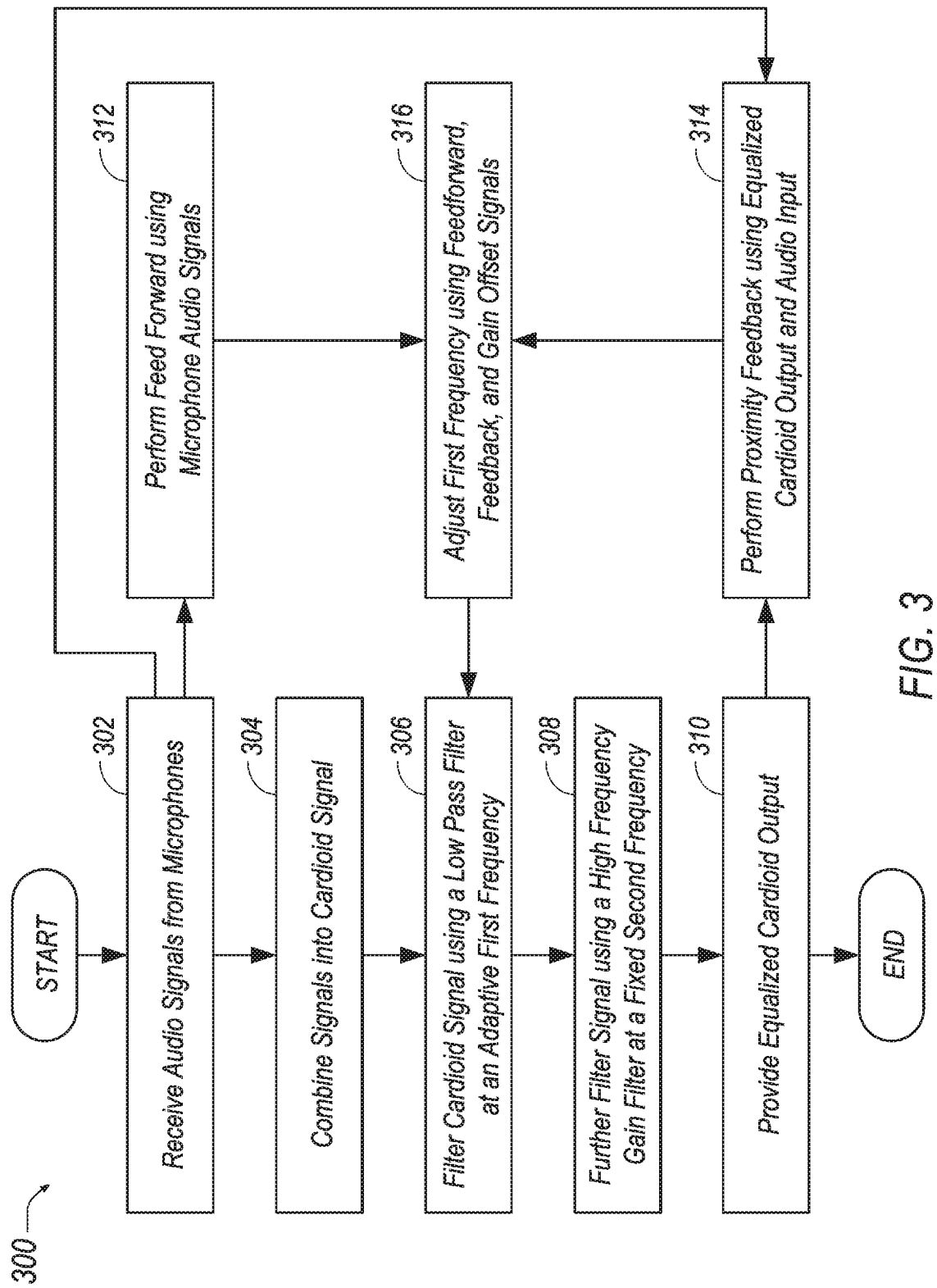
FIG. 3 illustrates an example process for performing cardioid microphone adaptive filtering.

FIG. 3 illustrates an example process 300 for performing cardioid adaptive filtering. In an example, the process 300 may be done by the computing device 102 performing the audio processing described in the diagram 200. The process 300 begins at operation 302, in which the audio processor 104 receives audio input signals 108 from each of a pair of microphones 106. At 304, the audio processor 104 combines the audio input signals 108 into a cardioid signal 206. This may include accounting for delays in sound traveling between the microphones 106.

At 306, the audio processor 104 filters the cardioid signal 206 using the adaptive low pass filter 208 at the $f_1$ frequency. At 308, the audio processor 104 further filters the first filtered output 210 produced at operation 306 using the high frequency gain filter 212 to create the equalized cardioid output 110 (the high frequency gain filter 212 is a magnitude-flipped low-pass filter, where the fixed gain is in low frequency). This output may be provided by the audio processor 104 for further use at operation 310.

At 312, using the audio input signals 108 received at operation 302, the audio processor 104 performs feedforward processing to provide a feedforward signal to the frequency control. Additionally, at 314, using the equalized cardioid output 110 and the audio input 108, the audio processor 104 performs proximity feedback to generate a feedback signal. The feedforward signal and the feedback signal may be provided to the feedback control at operation 316, whereby the audio processor 104 dynamically adapts the frequency $f_1$ utilized at operation 306. Notably, the processing of control operations 312-316 may be performed concurrent to the processing operations 304-310 as discussed above.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, JAVA™, C, C++, VISUAL BASIC, JAVA SCRIPT, PERL, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio device for performing cardioid adaptive filtering comprising:

first and second omnidirectional microphones, the first omnidirectional microphone configured to provide a first audio input signal, the second omnidirectional microphone configured to provide a second audio input signal; and an audio processor, programmed to combine the first and second audio input signals into a cardioid signal, filter the cardioid signal to create a first filtered output using an adaptive low pass filter controlled by a frequency control, the adaptive low pass filter having a controllable corner frequency $f_1$, filter the first filtered output, using a high frequency gain filter with a corner frequency $f_2$, to create an equalized cardioid output signal, perform feedforward processing of the first and second audio input signals to provide a wind feedforward signal, using the equalized cardioid output and the first or second audio input signal, perform proximity feedback to generate a proximity feedback signal, adjust the frequency $f_1$ of the adaptive low pass filter using the wind feedforward signal and the proximity feedback signal, and provide the equalized cardioid output signal for use in receiving captured audio.

2. The audio device of claim 1, wherein the adaptive low pass filter is a first order filter with a constant gain below the frequency $f_1$ and a decreasing gain above the frequency $f_1$.

3. The audio device of claim 1, wherein the high frequency gain filter is a first order filter with a constant gain below the frequency $f_2$ and an increasing gain above the frequency $f_2$.

4. The audio device of claim 1, wherein the audio processor is further programmed to:

compute a scaled time-averaged low frequency root-mean-square (RMS) level difference between an RMS of the cardioid output signal and an RMS of the first or second audio input signal, wherein the proximity feedback signal uses the first or second audio input signal as a reference to determine a difference in bass level of the cardioid output signal as compared to a bass level of the first or second audio input signal, and utilize the difference in bass level as an input to the frequency control to adapt the frequency $f_1$ to reduce the difference in bass level.

5. The audio device of claim 4, wherein audio processor is further programmed to perform RMS calculations of the cardioid output signal and the first audio input signal using one or more of (i) a bass band exponential moving average filter, (ii) a moving block time average, or (iii) audio frame averages.

6. The audio device of claim 1, wherein the audio processor is further programmed to:

determine a scaled time-averaged low frequency root-mean-square (RMS) level absolute-value difference signal between the first audio input signal and the second audio input signal; and apply the absolute-value difference signal as an input to the frequency control to adjust the frequency $f_1$ to implement a low-frequency gain reduction when a pressure difference between the first audio input signal and the second audio input signal indicates that an uncorrelated micro-turbulence is being experienced by the first and second omnidirectional microphones.

7. The audio device of claim 6, wherein audio processor is further programmed to perform the scaled time-averaged low frequency RMS calculations using one or more of (i) a bass band exponential moving average filter, (ii) a moving block time average, or (iii) audio frame averages.

8. The audio device of claim 1, wherein the audio processor is further programmed to apply a fixed gain offset as an input to the frequency control to be used to provide a fixed equalization adjustment.

9. The audio device of claim 1, wherein the audio processor is further programmed to combine the first and second audio input signals into the cardioid signal by subtracting a delayed version of second audio input signal from the first audio input signal.

10. The audio device of claim 1, wherein the first omnidirectional microphone is mounted to a side of the device, and the second omnidirectional microphone is mounted to an opposite, adjacent, or same side of the device with a setback, to create a directional sound vector.

11. A method for performing cardioid adaptive filtering comprising:

receiving a first audio input signal from a first omnidirectional microphone;

receiving a second audio input signal from a second omnidirectional microphone;

combining the first and second audio input signals into a cardioid signal;

filtering the cardioid signal to create a first filtered output using an adaptive low pass filter controlled by a frequency control, the adaptive low pass filter having a controllable corner frequency $f_1$;

filtering the first filtered output, using a high frequency gain filter with a corner frequency $f_2$, to create an equalized cardioid output signal;

performing feedforward processing of the first and second audio input signals to provide a wind feedforward signal;

using the equalized cardioid output and the first or second audio input, performing proximity feedback to generate a proximity feedback signal;

adjusting the frequency $f_1$ of the adaptive low pass filter using the wind feedforward signal and the proximity feedback signal; and providing the equalized cardioid output signal for use in receiving captured audio.

12. The method of claim 11, wherein the adaptive low pass filter is a first order filter with a constant gain below the frequency $f_1$ and a decreasing gain above the frequency $f_1$.

13. The method of claim 11, wherein the high frequency gain filter is a first order filter with a constant gain below the frequency $f_2$ and an increasing gain above the frequency $f_2$.

14. The method of claim 11, further comprising:

computing a scaled time-averaged low frequency root-mean-square (RMS) level difference between the RMS of the cardioid output signal and the RMS of the first or second audio input signal, wherein the proximity feedback signal uses the first or second audio input signal as a reference to determine a difference in bass level of the cardioid output signal as compared to a bass level of the first or second audio input signal, and utilizing the difference as an input to the frequency control to adapt the frequency $f_1$ to reduce the difference.

15. The method of claim 11, further comprising:

determining a scaled time-averaged low frequency root-mean-square (RMS) level absolute-value difference signal between the first audio input signal and the second audio input signal; and applying the absolute-value difference signal as an input to the frequency control to adjust the frequency $f_1$ to implement low-frequency gain reduction in cases of a pressure difference between the first audio input signal and the second audio input signal indicative of uncorrelated micro-turbulence being experienced by the first and second omnidirectional microphones.

16. The method of claim 11, further comprising applying a fixed gain offset as an input to the frequency control to be used to provide a fixed equalization adjustment.

17. The method of claim 11, further comprising combining the first and second audio input signals into the cardioid signal by subtracting a delayed version of second audio input signal from the first audio signal.

18. The method of claim 11, wherein the first omnidirectional microphone is mounted to a side of a device, and the second omnidirectional microphone is mounted to an opposite, adjacent, or same side of the device with a setback, to create a directional sound vector.

19. A non-transitory computer-readable medium comprising instructions for performing cardioid adaptive filtering comprising that, when executed by an audio processor, cause the audio processor to:
  receive a first audio input signal from a first omnidirectional microphone;
  receive a second audio input signal from a second omnidirectional microphone;
  combine the first and second audio input signals into a cardioid signal by subtracting a delayed version of second audio input signal from the first audio signal;
  filter the cardioid signal to create a first filtered output using an adaptive low pass filter controlled by a frequency control, the adaptive low pass filter having a controllable corner frequency $f_1$;
  filter the first filtered output, using a high frequency gain filter with a corner frequency $f_2$, to create an equalized cardioid output signal;
  perform feedforward processing of the first and second audio input signals to provide a wind feedforward signal;
  use the equalized cardioid output and the first or second audio input, performing proximity feedback to generate a proximity feedback signal;
  adjust the frequency $f_1$ of the adaptive low pass filter using the wind feedforward signal and the proximity feedback signal; and
  provide the equalized cardioid output signal for use in receiving captured audio.

20. The medium of claim 19, wherein one or more of (i) the adaptive low pass filter is a first order filter with a constant gain below the frequency $f_1$ and a decreasing gain above the frequency $f_1$, and (ii) the high frequency gain filter is a first order filter with a constant gain below the frequency $f_2$ and an increasing gain above the frequency $f_2$.

21. The medium of claim 19, further comprising instructions that, when executed by the audio processor, cause the audio processor to:
  compute a scaled time-averaged low frequency root-mean-square (RMS) level difference between the RMS of the cardioid output signal and the RMS of the first or second audio input signal, wherein the proximity feedback signal uses the first or second audio input signal as a reference to determine a difference a bass level of the cardioid output signal as compared to a bass level of the first or second audio input signal, and
  utilize the difference as an input to the frequency control to adapt the frequency $f_1$ to reduce the difference.

22. The medium of claim 19, further comprising instructions that, when executed by the audio processor, cause the audio processor to:
  determine a scaled time-averaged low frequency root-mean-square (RMS) level absolute-value difference signal between the first audio input signal and the second audio input signal; and
  apply the absolute-value difference signal as an input to the frequency control to adjust the frequency $f_1$ to implement low-frequency gain reduction in cases of a pressure difference between the first audio input signal and the second audio input signal indicative of uncorrelated micro-turbulence being experienced by the first and second omnidirectional microphones.

23. The medium of claim 19, further comprising instructions that, when executed by the audio processor, cause the audio processor to apply a fixed gain offset as an input to the frequency control to be used to provide a fixed equalization adjustment.

* * * * *